United States Patent
Shiobara et al.

(10) Patent No.: US 7,662,542 B2
(45) Date of Patent: Feb. 16, 2010

(54) PATTERN FORMING METHOD AND SEMICONDUCTOR DEVICE MANUFACTURING METHOD

(75) Inventors: Eishi Shiobara, Yokohama (JP); Takehiro Kondoh, Yokohama (JP); Yuji Kobayashi, Yokohama (JP); Koutarou Sho, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 536 days.

(21) Appl. No.: 11/342,048

(22) Filed: Jan. 30, 2006

(65) Prior Publication Data

US 2006/0189147 A1 Aug. 24, 2006

(30) Foreign Application Priority Data

Jan. 31, 2005 (JP) ............... 2005-023923

(51) Int. Cl.
 *G03F 7/20* (2006.01)
 *G03F 7/004* (2006.01)
(52) U.S. Cl. .............. 430/311; 430/5; 430/285.1; 430/394
(58) Field of Classification Search ............ 430/311, 430/328, 5
 See application file for complete search history.

(56) References Cited

U.S. PATENT DOCUMENTS

| 4,873,177 A * | 10/1989 | Tanaka et al. ............ 430/326 |
| 6,093,508 A * | 7/2000 | Cote ........................ 430/11 |
| 2003/0036603 A1* | 2/2003 | Hasegawa et al. ........... 525/107 |
| 2004/0029047 A1* | 2/2004 | Ishibashi et al. ........... 430/296 |
| 2004/0048200 A1* | 3/2004 | Ishibashi .................. 430/311 |
| 2004/0072096 A1* | 4/2004 | Terai et al. .............. 430/270.1 |

FOREIGN PATENT DOCUMENTS

| JP | 07-130651 | | 5/1995 |
| JP | 07130651 A | * | 5/1995 |
| JP | 3057879 | | 4/2000 |
| JP | 3057879 B2 | * | 7/2000 |
| JP | 2002-217170 | | 8/2002 |
| JP | 2003-140361 | | 5/2003 |
| JP | 2003140361 A | * | 5/2003 |
| JP | 2004-77951 | | 3/2004 |
| JP | 2004-093832 | | 3/2004 |

OTHER PUBLICATIONS

English translation: JP 2004077951, date: Mar. 2004, inventor: Ozawa et al.*
English translation: JP 2002217170, date: Aug. 2002, inventor: Mansei, Akira.*
Notification of Reasons for Rejection issued by the Japanese Patent Office on Feb. 26, 2008, for Japanese Patent Application No. 2005-23923, and English-language translation thereof.
Notice of Reasons for Rejection mailed Jul. 1, 2008, from the Japanese Patent Office in counterpart Japanese Application No. 2005-023923.

* cited by examiner

*Primary Examiner*—Mark F Hull
*Assistant Examiner*—Rashid Alam
(74) *Attorney, Agent, or Firm*—Finnegan, Henderson, Farabow, Garrett & Dunner, L.L.P.

(57) ABSTRACT

A pattern forming method includes the following steps. A resist pattern is formed on a to-be-processed film. A mask pattern including the resist pattern and a resin film formed on a surface of the resist pattern is formed. Slimming of the mask pattern is executed.

12 Claims, 5 Drawing Sheets

PATTERN FORMING METHOD AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2005-023923, filed Jan. 31, 2005, the entire contents of which are incorporated herein by reference.

BACKGROUND OF THE INVENTION

1. Field of the Invention

The present invention relates to a pattern forming method using a resist pattern.

2. Description of the Related Art

A resist pattern which is composed of a photosensitive material and processed by lithography technology is used as a mask to process a film and selectively form a diffusion layer (Jpn. Pat. Appln. KOKAI Publication No. 2003-140361). As the resist pattern is miniaturized, a problem arises in that a manufactured semiconductor device is defective because of processing failure of the to-be-processed film and formation failure of the diffusion layer.

BRIEF SUMMARY OF THE INVENTION

According to a first aspect of the present invention, there is provided a pattern forming method comprising: forming a resist pattern on a to-be-processed film; forming a mask pattern including the resist pattern and a resin film formed on a surface of the resist pattern; and slimming the mask pattern.

According to a second aspect of the present invention, there is provided a pattern forming method comprising: forming a resist pattern on a to-be-processed film; forming a mask pattern including the resist pattern and a resin film formed on a surface of the resist pattern; forming a to-be-processed film pattern by etching the to-be-processed film using the mask pattern as a mask; and slimming the to-be-processed film pattern.

According to a third aspect of the present invention, there is provided a resist pattern forming method comprising: forming a mask film on a to-be-processed film; coating a resin solution containing resin on the mask film; forming a cross-linked layer and a non-cross-linked layer from the resin solution, the cross-linked layer being formed by causing the resin to cross-link, the non-cross-linked layer mainly comprising the resin that is not cross linked; removing the non-cross-linked layer; and forming a resist pattern on the cross-linked layer.

According to a fourth aspect of the present invention, there is provided a resist pattern forming method comprising: forming a to-be-processed film on a foundation member; forming a resist film on the to-be-processed film; forming a latent image pattern in the resist film; forming a resist pattern in the resist film by developing the resist film in which the latent image is formed by a first solution that does not dissolve the to-be-processed film; coating a resin solution which does not dissolve the to-be-processed film and contains resin on the resist pattern; forming a cross-linked layer and a non-cross-linked layer from the resin solution, the cross-linked layer being formed by causing the resin to cross-link, the non-cross-linked layer mainly comprising the resin that is not cross linked; removing the non-cross-linked layer; and etching the to-be-processed film between a gap of the resist patterns with the cross-linked layer by a second solution that does not dissolve the cross-linked layer.

DETAILED DESCRIPTION OF THE INVENTION

Embodiments of the present invention will be described below with reference to the drawings.

First Problem

As the dimension in design of a semiconductor device is miniaturized, a problem arises particularly in the roughness of a resist pattern after it is developed. The roughness is transferred to a to-be-processed film, thereby the dimension controllability of a device pattern is degraded. The prior art mainly approaches a roughness reducing method through material. However, reducing roughness made by the method approaching from the material side has a trade off relationship to a resolution property required to a resist such as an increase of an acid diffusion length after exposure, and the like.

Further, it is known that a side wall resin film forming method disclosed in Japanese Patent No. 3057879 is also effective in reducing the roughness of a resist. However, the side wall resin film forming method was originally intended to correct the dimension of a resist pattern and thus varies the dimension of the pattern as the roughness is reduced.

First Embodiment

FIGS. 1A to 1F are sectional views sequentially showing steps of manufacturing a semiconductor device according to a first embodiment of the present invention. Note that, in the following description, the term "wafer" means a structure obtained by the processes executed until the time at which the term is mentioned.

Figure 1A:
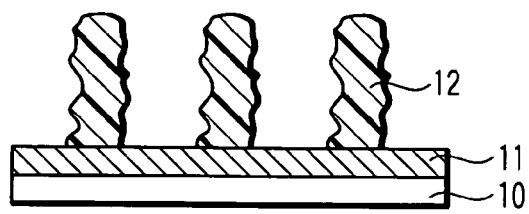
FIGS. 1A, 1B, 1C, 1D, 1E, and 1F are sectional views sequentially showing steps of manufacturing a semiconductor device according to a first embodiment of the present invention.

As shown in FIG. 1A, a silicon oxide film 10 of 2 nm thick and a polysilicon film (to-be-processed film) 11 of 150 nm thick are formed on a silicon substrate (not shown). An organic anitreflection film (not shown) is coated on the polysilicon film 11 so as to have a thickness of 78 nm and heated on a hot plate at 190° C. for 60 seconds.

To form a ArF chemical amplification resist film of 300 nm thick, an ArF chemical amplification positive resist material is coated on the anitreflection film and heated on the hot plate at 120° C. for 60 seconds.

A line and space (L/S) pattern of 100 nm thick is transferred onto the resist film by an ArF excimer laser exposure tool through a half-tone mask having a transmittance of 6%. As illumination conditions, NA is set to 0.68, σ is set to 0.75, and ⅔ annular illumination is employed. Then, a post exposure baking (PEB) treatment is executed on the hot plate at 130° C. for 60 seconds. After the wafer was immersed for 60 seconds in a developer adjusted to 23° C., a resist pattern 12 having a desired dimension was obtained by exposure dose of 32 mJ/cm$^2$. Variation among line widths measured as the roughness of a 100-nm L/S pattern was 10.8 nm in terms of 3σ.

Figure 1B:
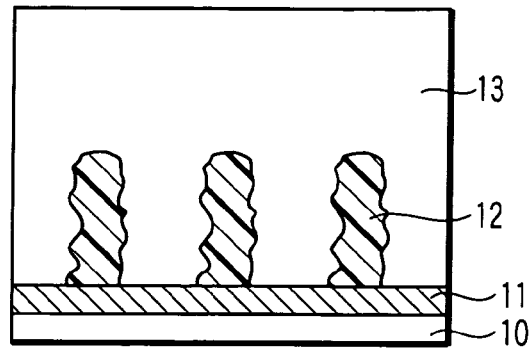

As shown in FIG. 1B, a resin solution 13 is coated on the resist pattern 12. The resin solution 13 contains a solvent and a water-soluble resin, and a resin that is cross-linked by heat is used. An ultra-micro processing assistant material made by Clariant may be used as the resin solution 13.

Figure 1C:
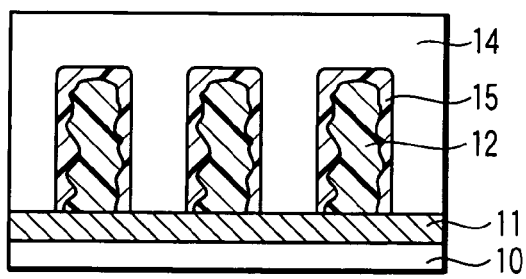

As shown in FIG. 1C, the wafer is heated on a hot plate at 130° C. for 90 seconds. As a result, a resin film 14 is formed on the overall surface of the wafer by volatilizing the solvent in the resin solution 13 as well as a cross-linked layer 15 is formed on the interface between the resist pattern 12 and the resin film 14. The resin film 14 is formed by the cross-link reaction of the resin in the resin solution 13. In contrast, the resin film 14 (non-cross-linked layer) is mainly composed of a non-cross-linked resin.

Figure 1D:
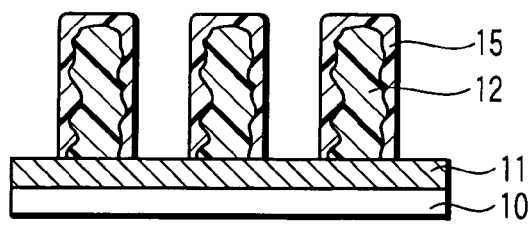

As shown in FIG. 1D, the resin film 14 is removed by rinsing with pure water for 60 seconds. A measured line width of the resist pattern 12 having the cross-linked layer 15 formed on a surface thereof was 17 nm thicker than a desired dimension. A measured variation of the line width as roughness showed that the roughness was improved by 7.8 nm in terms of 3σ. Hereinafter, the resist pattern 12 and the cross-linked layer 15 are referred as mask pattern 12 and 15.

Figure 1E:
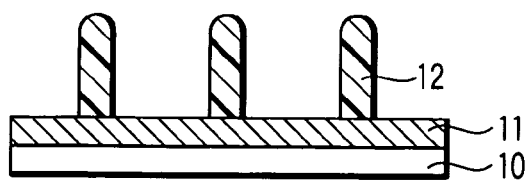

As shown in FIG. 1E, slimming (thinning) is executed to correct the increased line width of the mask pattern 12 and 15. Here, slimming is a step for making the line width of a pattern to be transferred on the to-be-processed film thinner than the line width of a mask pattern formed on the to-be-processed film by a method such as reactive ion etching (RIE). The slimming is executed by, for example, the RIE method using a plasma containing oxygen.

After the slimming, a measured amount of slimming of the mask pattern 12 and 15 was 20 nm, which sets the width of the mask pattern 12 and 15 sufficiently within the range of a dimensional accuracy. It was also found that the variation among the line widths is 3σ=8.0 nm, which has not changed from the time the cross-linked layer 15 was formed (from the time before the slimming). Note that the amount of slimming can be controlled by changing a RIE time.

Figure 1F:
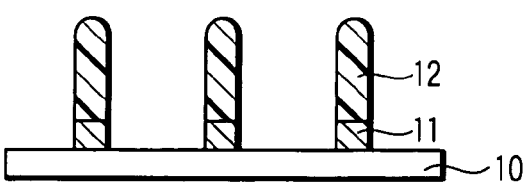

A 100-nm thick L/S pattern is obtained by processing the polysilicon film 11 in the RIE condition including halogen gas as shown in FIG. 1F. The roughness of the formed 100-nm polysilicon L/S pattern exhibits an excellent value of 3σ=8 nm.

Conventionally, since a cross-linked layer is formed on the surface of a resist pattern, the resist pattern must be formed smaller than the dimension of a target pattern. To form the thin resist pattern, the exposure margin such as exposure tolerance and focal depth tolerance during exposure is narrowed. In the embodiment, since the slimming is executed after the cross-linked layer 15 is formed, the pattern can be transferred in the condition of a wide exposure margin. An amount of slimming is by no means limited to the embodiment, and the line width of the to-be-processed film may be smaller than the line width of the resist pattern after exposure.

According to the embodiment, since the roughness of the mask pattern 12 and 15 is suppressed, processing failure of the polysilicon film 11 in etching can be suppressed, thereby a yield can be improved. Further, since pattern can be transferred to the resist pattern 12 in the condition of the wide exposure margin, defective formation of the resist pattern 12 can be suppressed, thereby improving the yield.

Second Embodiment

FIGS. 2A to 2F are sectional views showing steps of manufacturing a semiconductor device according to a second embodiment of the present invention.

Since the steps shown in FIGS. 2A to 2D are the same as those explained with reference to FIGS. 1A to 1D of the first embodiment, the explanation thereof is omitted.

Figure 2A:
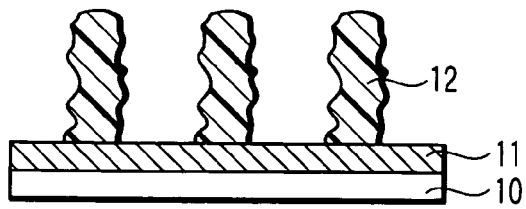
FIGS. 2A, 2B, 2C, 2D, 2E, and 2F are sectional views showing steps of manufacturing a semiconductor device according to a second embodiment of the present invention.
Figure 2B:
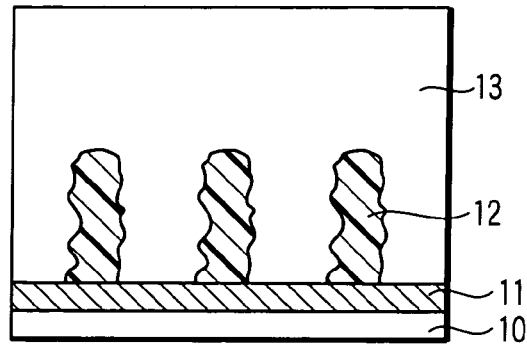
Figure 2C:
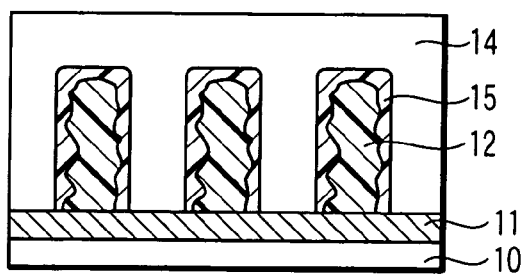
Figure 2D:
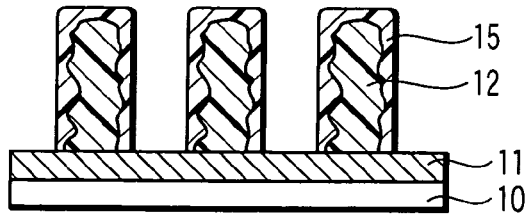
Figure 2E:
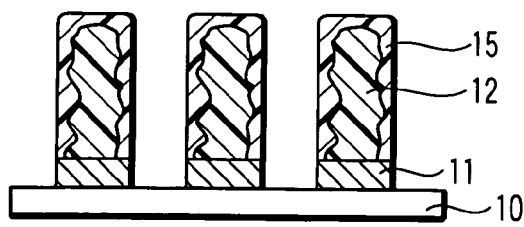

As shown in FIG. 2E, a polysilicon film 11 is processed in an RIE condition including halogen gas. The line width of the polysilicon film 11 was 17 nm thicker than a desired dimension. However, the roughness of a 100-nm L/S pattern of the formed polysilicon film 11 exhibits an excellent value in terms of dispersion of line width of 3σ=8 nm.

Figure 2F:
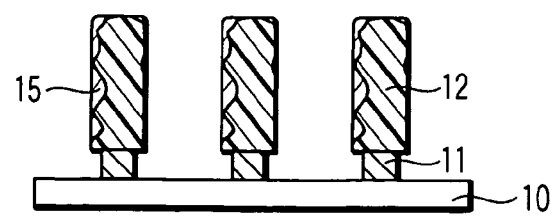

As shown in FIG. 2F, to correct the increased line width of the pattern, the polysilicon film 11 is slimmed by the RIE method using a plasma containing halogen gas. Then, a measured amount of slimming of the polysilicon film 11 was 20 nm, which sets the width of the polysilicon film 11 sufficiently within the range of a dimensional accuracy. Further, it is also found that the variation among line widths is 3σ=8.0 nm which is has not changed from the time the cross-linked layer 15 was formed (from the time before the slimming). Note that the amount of slimming can be controlled by changing the RIE time.

Conventionally, since a cross-linked layer is formed on the surface of a resist pattern, the resist pattern must be formed smaller than the dimension of a target pattern. To form the thin resist pattern, the exposure margin such as exposure tolerance and focal depth tolerance during exposure is narrowed. In the embodiment, since the polysilicon film 11 is slimmed after the patterning thereof is executed, the pattern can be transferred in the condition of a wide exposure margin. The amount of slimming is by no means limited to the embodiment, and the line width of the to-be-processed film may be smaller than the line width of the resist pattern after exposure.

According to the embodiment, since the roughness of mask pattern 12 and 15 is suppressed, processing failure of the polysilicon film 11 in etching can be suppressed, thereby a yield can be improved. Further, since the pattern can be transferred to the resist pattern 12 in the condition of the wide exposure margin, defective formation of the resist pattern 12 can be suppressed, thereby improving the yield.

Second Problem

In general, a method of manufacturing a semiconductor device includes many steps of depositing materials as a to-be-processed film on a silicon wafer and patterning the to-be-processed film to a desired pattern. In the patterning of the to-be-processed films, first, a resist film is formed on the to-be-processed film and a predetermined region of the resist film is exposed. Next, a resist pattern is formed by removing the exposed portion or an unexposed portion of the resist film by development, and further the to-be-processed film is dry etched by using the resist pattern as a mask.

Ultraviolet rays such as KrF excimer laser and ArF excimer laser are used as an exposure light source from a view point of throughput. However, as a large scale integrated circuit (LSI) is miniaturized, required resolution is becoming smaller than the wavelength of the ultraviolet rays, and thus the tolerance of an exposure process such as an exposure tolerance and a focusing tolerance becomes insufficient. In particular, a miniature line pattern is highly possible to fall down, and a dimension of about 50 nm is a practical limit. Although it is examined to alter an exposure light source and to develop a novel resist material, these method may increase cost. Thus, there is a requirement for a method of forming a more miniature line pattern without falling down it and without greatly altering an apparatus and a material.

Third and fourth embodiments will explain methods directed to the second problem.

Third Embodiment

FIGS. 3A to 3F are sectional views showing steps of manufacturing a semiconductor device according to a third embodiment of the present invention.

Figure 3A:
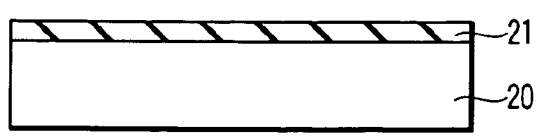
FIGS. 3A, 3B, 3C, 3D, 3E, 3F, 3G, and 3H are sectional views showing steps of manufacturing a semiconductor device according to a third embodiment of the present invention.

As shown in FIG. 3A, to form a SOG (spin on glass) film 21 of 80 nm thick, an SOG film forming material is spin coated on a silicon substrate 20, and then, it is baked at 205° C. for 60 seconds.

Figure 3B:
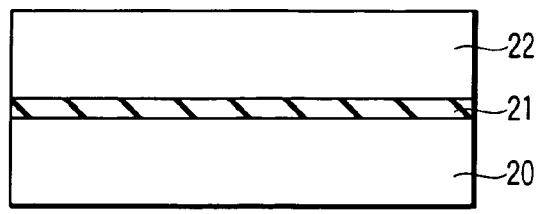

As shown in FIG. 3B, a resin solution 22 is spin coated on the SOG film 21 to a thickness of 300 nm. The resin solution 22 contains a solvent and a water-soluble resin. The same solution as the resin solution 13 may be used as the resin solution 22.

Figure 3C:
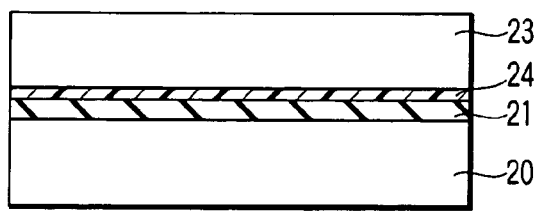

As shown in FIG. 3C, the wafer is baked at 120° C. for 60 seconds. As a result, a resin film 23 is formed by evaporating the solvent in the resin solution 22 as well as a cross-linked layer 24 of 3 nm thick is formed on the SOG film 21. The cross-linked layer 24 is formed by the cross-link reaction of the resin in the resin solution 22. The resin film 23 (non-cross-linked layer) is mainly composed of a non-cross-linked resin.

Figure 3D:
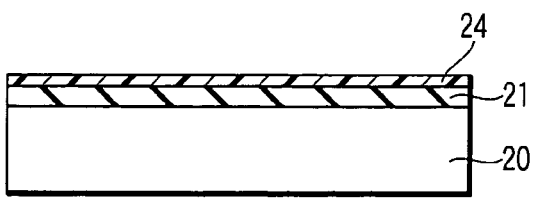

As shown in FIG. 3D, the resin film 23 is removed by rinsing using pure water for 60 seconds.

Figure 3E:
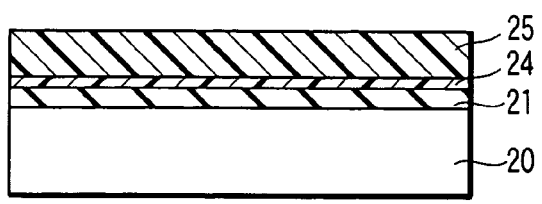

As shown in FIG. 3E, after an ArF positive DUV resist film forming material is spin coated on the cross-linked layer 24, the wafer is baked at 130° C. for 60 seconds, thereby a resist film 25 of 150 nm thick is formed.

Figure 3F:
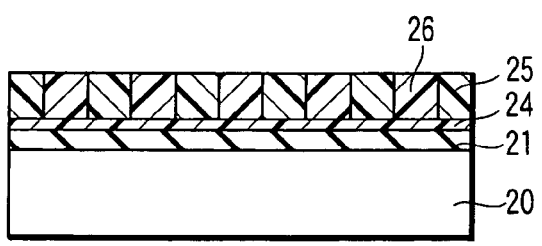

An L/S pattern is transferred to the resist film 25 by an ArF excimer exposure tool using a half tone mask having a transmittance of 6% in the condition of NA=0.85, σ=0.90, and ¾ annular illumination. As a result, a latent image 26 of the pattern is formed (FIG. 3F).

Figure 3G:
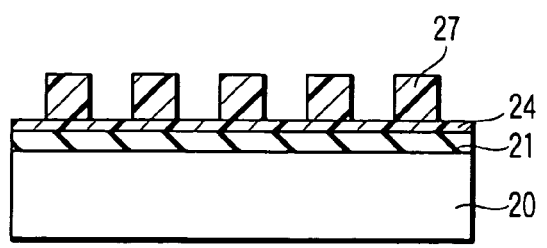

Further, after the wafer is baked at 130° C. for 90 seconds, it is subjected to paddle development for 30 seconds by using an tetramethylammonium hydroxide (TMAH) solution. The L/S pattern of 0.07 μm thick or less is formed by increasing exposure energy in increments of 1 mJ from 28 mJ/cm². As shown in FIG. 3G, the L/S pattern 27 having a thickness of 0.045 μm was formed when the exposure energy was incremented to 35 mJ. The cross-linked layer 24 and the L/S pattern 27 are so glued to each other that collapse of the resist pattern is suppressed.

Figure 3H:
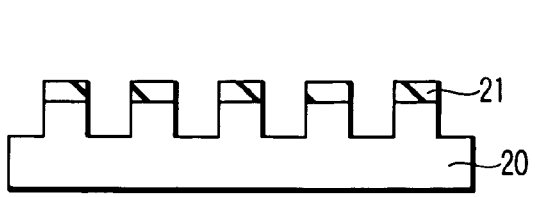

As shown in FIG. 3H, the cross-linked layer 24, the SOG film 21, and the silicon substrate 20 are etched by using the L/S pattern 27 as a mask. The L/S pattern 27 and the cross-linked layer 24 are lost in the etching process.

As described above, since the collapse of the pattern is suppressed, the yield of a semiconductor device can be improved. When the thickness of the cross-linked layer 24 is more than 30 nm, the L/S pattern 27 is lost before the cross-linked layer 24 is patterned. However, since the cross-linked layer 24 is formed on the SOG film 21 thin, the L/S pattern 27 is not lost before the cross-linked layer 24 is patterned. Therefore, the SOG film 21 can be patterned.

Note that the embodiment can be also applied to a multi-layer resist process. In this case, a lower layer resist film is formed under the SOG film. The material of the lower layer resist film may be a novolak resin and the like. An organic film having a carbon content of 85 wt % or more is more preferable.

Further, although the silicon substrate 20 is used as the to-be-processed film in the embodiment, a polysilicon film, silicon oxide film, silicon nitride film, aluminum film, and the like may be used to manufacture the semiconductor device, and the to-be-processed film is not limited particularly to the silicon film.

Fourth Embodiment

FIGS. 4A to 4E are sectional views showing steps of manufacturing a semiconductor device according to a fourth embodiment of the present invention.

Figure 4A:
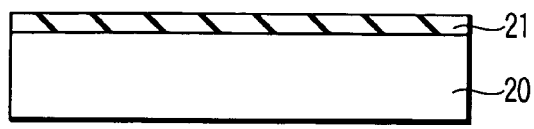
FIGS. 4A, 4B, 4C, 4D, and 4E are sectional views showing steps of manufacturing a semiconductor device according to a fourth embodiment of the present invention.

As shown in FIG. 4A, to form a SOG film 21 of 80 nm thick on a silicon substrate 20, an SOG film forming material is spin coated on the silicon substrate 20, and then, the wafer is baked at 205° C. for 60 seconds. Next, after a anitreflection film forming material is spin coated, it is spin dried. The anitreflection film forming material contains an acrylic resin that is cross-linked by heat.

Figure 4B:
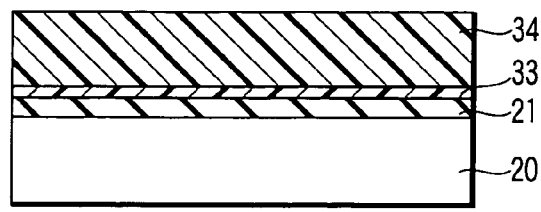

As shown in FIG. 4B, in the spin-dry, a anitreflection film 33, in which the resin contained in the anitreflection film forming material is cross-linked, and a non-cross-linked layer 34, which is mainly composed of a non-cross-linked resin, are formed. The anitreflection film 33 has a thickness of 5 nm, and the total film thickness of the anitreflection film 33 and the non-cross-linked layer 34 is 80 nm. It is necessary that the anitreflection film forming material be not entirely cross-linked by the spin-dry.

Figure 4C:
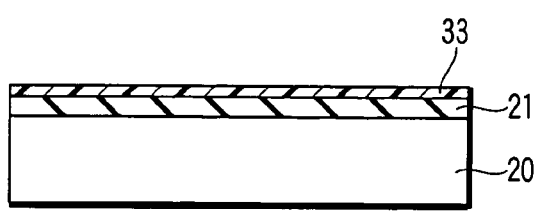

Next, as shown in FIG. 4C, a rinsing is executed for 30 seconds by using cyclohexanone to eliminate the non-cross-linked layer 34. Ordinarily, baking is executed after the spin-dry. When the baking is executed, the anitreflection film forming material is completely cross-linked, and thus the thin anitreflection film 33 cannot be obtained even by the rinse treatment using cyclohexanone.

Figure 4D:
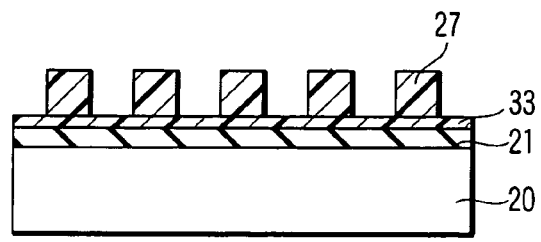

Next, as shown in FIG. 4D, an L/S pattern 27 is formed on the anitreflection film 33 by the same step as the third embodiment. The anitreflection film 33 and the L/S pattern 27 are so glued to each other that collapse of the resist pattern is suppressed.

Figure 4E:

As shown in FIG. 4E, the anitreflection film 33, the SOG film 21, and the silicon substrate 20 are etched by using the L/S pattern 27 as a mask. The L/S pattern 27 and the anitreflection film 33 are lost in the etching process.

As described above, since the collapse of the L/S pattern 27 is suppressed, the yield of a semiconductor device can be improved. When the thickness of the anitreflection film 33 is more than 30 nm, the L/S pattern 27 is lost before the anitreflection film 33 is patterned. However, since the anitreflection film 33 is formed on the SOG film 21 thin, the L/S pattern 27 is not lost before the SOG film 21 is patterned. Therefore, the SOG film 21 can be patterned.

Note that the embodiment can be also applied to a multi-layer resist process. In this case, a lower layer resist film is formed under the SOG film. The material of the lower layer resist film may be a novolak resin and the like. An organic film having a carbon content of 85 wt % or more is more preferable.

Further, although the silicon substrate 20 is used as a to-be-processed film in the embodiment, a polysilicon film, silicon oxide film, silicon nitride film, aluminum film, and the like may be used to manufacture the semiconductor device, and the to-be-processed film is not limited particularly to the silicon film.

Third Problem

In a prior art, a resist film is coated on an alkali-soluble anitreflection film, and the anitreflection film and the resist film are exposed and baked. Next, the resist film and the anitreflection film are developed at the same time by an alkali developer. However, this art makes the shape of the anitreflection film different among different patterns such as between a miniature space pattern and an isolated remaining pattern. This is because the intensity of light of the miniature space pattern that a resist senses is smaller than that of the isolated remaining pattern. As a result, the dissolving speed of the resist of the miniature space pattern is slower than that of the isolated remaining pattern, and thus the alkali-soluble anitreflection film starts dissolving at the miniature space pattern later than the isolated remaining.

A fifth embodiment will explain a method directed to the third problem.

Fifth Embodiment

FIGS. 5A to 5F are sectional views showing steps of manufacturing a semiconductor device according to a fifth embodiment of the present invention.

Figure 5A:
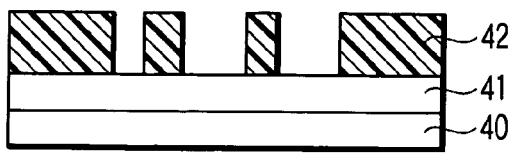
FIGS. 5A, 5B, 5C, 5D, 5E, and 5F are sectional views showing steps of manufacturing a semiconductor device according to a fifth embodiment of the present invention.

As shown in FIG. 5A, after a thermal cross-linking anitreflection film forming material is coated on a semiconductor device 40, it is baked at 200° C. for 60 seconds, thereby an organic anitreflection film 41 of 95 nm thick is formed.

A resist forming material is coated on the anitreflection film 41. The solution contained in the resist forming material does not dissolve the anitreflection film 41. The resist forming material may be an ESCAP resist material manufactured by JSR, which uses, for example, ethyl lactate as a solution. Next, the wafer is baked at 120° C. for 60 seconds, thereby a 300 nm thick resist film is formed.

The resist film is exposed with a half-tone mask having a transmittance of 6% used as a mask in an ordinary illumination condition, thereby a latent image pattern is formed on the resist film. Then, the resist film is baked at 120° C. for 60 seconds. A resist pattern 42 is formed by developing the resist film by 2.38 wt % of an aqueous tetramethylammonium hydroxide solution (alkali developer). The alkali developer does not dissolve the anitreflection film 41.

Figure 5B:
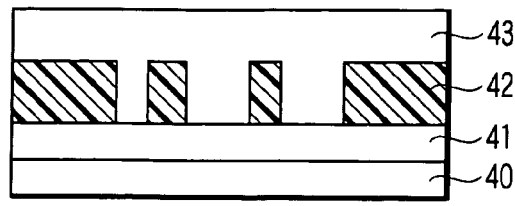

As shown in FIG. 5B, a resin solution 43 is coated on the resist pattern 42 to a thickness of 300 nm. The resin solution 43 contains a thermally cross-linked resin, and water and a water-soluble polymer as a solvent. The resin solution 43 does not dissolve the anitreflection film 41. A RELACS (registered trademark) agent may be used as the resin solution 43.

Figure 5C:
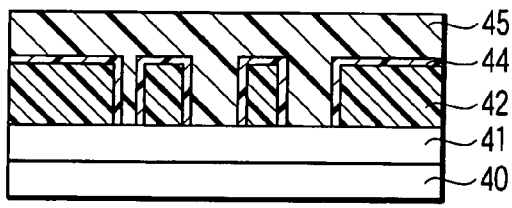

As shown in FIG. 5C, the wafer is baked for at 130° C. for 60 seconds. At the time, a cross-linked layer 44 composed of a cross-linked resin is formed between the resist pattern 42 and the resin solution 43 as well as the solvent in the resin solution 43 is volatilized, thereby a non-cross-linked layer 45 mainly composed of a water-soluble polymer is formed.

Figure 5D:
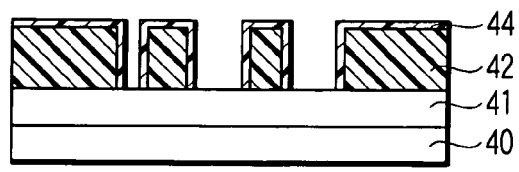

As shown in FIG. 5D, the non-cross-linked layer 45 is dissolved by a liquid that dose not dissolve the anitreflection film 41, for example, pure water, thereby the mask patterns 42 and 44 are revealed.

Figure 5E:
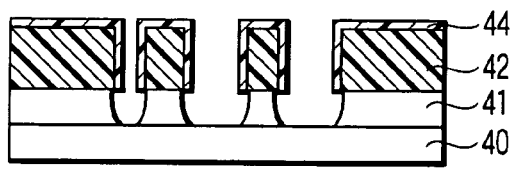

As shown in FIG. 5E, the anitreflection film 41 is etched by a solution that does not dissolve the cross-linked layer 44. A cyclohexanone solution, for example, may be used as the solution. In this case, an etching time is 60 seconds.

Figure 6:
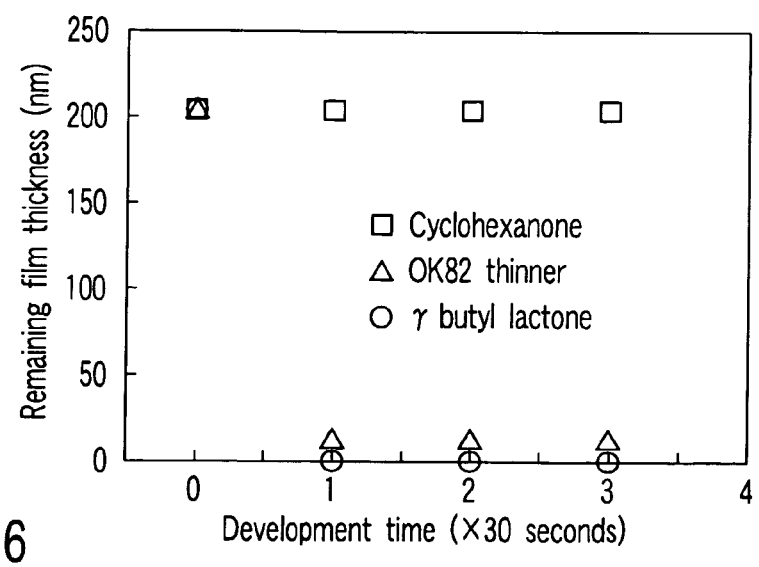
FIG. 6 is a graph showing the solubility of a cross-linked layer according to the fifth embodiment to various solutions.

FIG. 6 shows the solubility of the cross-linked layer 44 to various solutions. As shown in FIG. 6, the cross-linked layer 44 is not dissolved by the cyclohexanone solution. Note that an OK82 thinner and γ butyl lactone are used to remove a resist. The OK82 thinner is a solution contained in a mixed solution of propylene glycol methyl ether (80%) and propylene glycol mono-methyl ether acetate (20%).

Since the anitreflection film 41 and the resist film are not developed (etched) by the same step, the timing at which the anitreflection film 41 starts dissolving is not affected by the shape of the resist pattern. Accordingly, the anitreflection film starts dissolving at the same timing in the miniature space pattern and in the isolated remaining pattern. As a result, the pattern shape of the anitreflection film 41 is the same between even a different type of patterns.

Figure 5F:
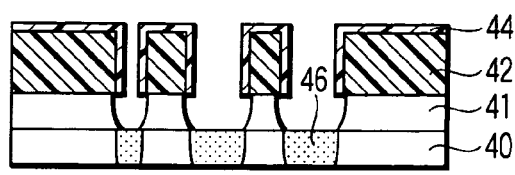

As shown in FIG. 5F, a diffusion layer 46 is formed by implanting ion into the semiconductor device 40 using the resist pattern 42 as a mask. The cross-linked layer 44, the resist pattern 42, and the anitreflection film 41 are removed, then annealing is executed.

According to the embodiment, the resist film and the anitreflection film 41 can be patterned by a different solution because the cross-linked layer 44, which is not dissolved by the solvent of a solution for removing the anitreflection film 41, is formed on the surface of the resist pattern 42. As a result, the pattern shape of the anitreflection film 41 is made to the same pattern shape between even a different type of the patterns.

The embodiment shows the formation of the ion implantation mask. However, the embodiment may be used also to other step.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resist pattern forming method comprising:
    forming an organic antireflection film on a foundation member;
    forming a resist film on the organic antireflection film;
    forming a latent image pattern in the resist film;
    forming a resist pattern in the resist film by developing the resist film in which the latent image is formed by a solution that does not dissolve the organic antireflection film;
    coating a resin solution which does not dissolve the organic antireflection film and contains resin on the resist pattern;
    forming a cross-linked layer and a non-cross-linked layer from the resin solution, the cross-linked layer being formed by causing the resin to cross-link, the non-cross-linked layer mainly comprising the resin that is not cross linked;
    removing the non-cross-linked layer; and
    etching the organic antireflection film between a gap of the resist patterns with the cross-linked layer by an organic solution that dissolves the organic antireflection film and does not dissolve the cross-linked layer.

2. The method according to claim 1, wherein forming the resist film includes:
    coating a material of the resist that does not dissolve the organic antireflection film on the organic antireflection film; and
    forming the resist film from the material.

3. The method according to claim 1, wherein the resin is a water soluble polymer.

4. The method according to claim 1, wherein the foundation member is a semiconductor substrate,
    the method further comprising implanting impurities into the semiconductor substrate with the resist pattern and the cross-linked layer used as a mask after the organic antireflection film is etched.

5. A method of manufacturing a semiconductor device, comprising the pattern forming method according to claim 1.

6. A resist pattern forming method comprising:
    forming an organic antireflection film on a foundation member;
    forming a resist film on the organic antireflection film;
    forming a latent image pattern in the resist film;

applying a solution that does not dissolve the organic antireflection film to the resist film to develop the resist film in which the latent image is formed, thereby forming a resist pattern in the resist film;

coating a resin solution which does not dissolve the organic antireflection film and contains resin on the resist pattern;

forming a cross-linked layer and a non-cross-linked layer from the resin solution, the cross-linked layer being formed by causing the resin to cross-link, the non-cross-linked layer mainly comprising the resin that is not cross linked;

removing the non-cross-linked layer; and applying an organic solution which dissolves the organic antireflection film and does not dissolve the cross-linked layer to the organic antireflection film between a gap of the resist patterns with the cross-linked layer, thereby etching the organic antireflection film between the gap.

7. The method according to claim 6, wherein forming the resist film includes:

coating a material of the resist that does not dissolve the organic antireflection film on the organic antireflection film; and forming the resist film from the material.

8. The method according to claim 6, wherein the resin is a water soluble polymer.

9. The method according to claim 6, wherein the foundation member is a semiconductor substrate, the method further comprising implanting impurities into the semiconductor substrate with the resist pattern and the cross-linked layer used as a mask after the organic antireflection film is etched.

10. A method of manufacturing a semiconductor device, comprising the pattern forming method according to claim 6.

11. The method according to claim 1, wherein the organic solution comprises cyclohexanone solution.

12. The method according to claim 6, wherein the organic solution comprises cyclohexanone solution.

* * * * *